US011315461B2

(12) United States Patent
Tian et al.

(10) Patent No.: US 11,315,461 B2
(45) Date of Patent: Apr. 26, 2022

(54) MULTIPLEX SHIFT REGISTER UNIT AND DRIVING CIRCUIT THEREOF, DISPLAY PANEL AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Zhenguo Tian, Beijing (CN); Hailong Wu, Beijing (CN); Xiuzhu Tang, Beijing (CN); Shuang Hu, Beijing (CN); Qiyuan Wei, Beijing (CN); Qi Li, Beijing (CN); Shuai Chen, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 74 days.

(21) Appl. No.: 16/835,472

(22) Filed: Mar. 31, 2020

(65) Prior Publication Data

US 2021/0065600 A1 Mar. 4, 2021

(30) Foreign Application Priority Data

Sep. 3, 2019 (CN) .......................... 201910826198.1

(51) Int. Cl.
*G09G 5/00* (2006.01)
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
CPC ............. G09G 3/20; G09G 2300/0408; G09G 2300/0452; G09G 2310/0286;
(Continued)

(56) References Cited

U.S. PATENT DOCUMENTS 9,524,665 B2 * 12/2016 Peng .................... G09G 3/3674
2017/0061855 A1 * 3/2017 Tsai ..................... G09G 3/3266
(Continued)

FOREIGN PATENT DOCUMENTS

CN 106898292 B * 7/2018 ............. G11C 19/28

*Primary Examiner* — Adam R. Giesy
(74) *Attorney, Agent, or Firm* — Westman, Champlin & Koehler, P.A.

(57) ABSTRACT

The present disclosure discloses a multiplex shift register unit and a driving circuit thereof, a display panel, and a display device. The multiplex shift register unit includes a shift register unit connected to an input terminal, a first power supply terminal, a second power supply terminal, a clock signal terminal, a reset terminal, and an output terminal respectively; and a multiplex unit connected to the output terminal, the first power supply terminal, the second power supply terminal, a first multiplex output terminal and a second multiplex output terminal respectively.

12 Claims, 4 Drawing Sheets

(52) U.S. Cl.
CPC ............... *G09G 2300/0452* (2013.01); *G09G 2310/0286* (2013.01); *G09G 2310/0297* (2013.01); *G09G 2310/08* (2013.01); *G09G 2330/021* (2013.01)

(58) Field of Classification Search
CPC ....... G09G 2310/0297; G09G 2310/08; G09G 2330/021; G09G 3/3674; G09G 3/3685; G09G 3/3266; G09G 3/3275; G11C 19/28; G11C 19/00; G11C 19/36
See application file for complete search history.

(56) References Cited

U.S. PATENT DOCUMENTS

2018/0190180 A1\* 7/2018 Shang .................. G09G 3/3677
2020/0265762 A1\* 8/2020 Zhao ...................... G11C 19/28

\* cited by examiner

(Prior Art)

MULTIPLEX SHIFT REGISTER UNIT AND DRIVING CIRCUIT THEREOF, DISPLAY PANEL AND DISPLAY DEVICE

CROSS-REFERENCE TO RELATED APPLICATION(S)

This application claims priority to the Chinese Patent Application No. CN 201910826198.1, filed on Sep. 3, 2019, which is incorporated herein by reference in its entirety.

TECHNICAL FIELD

The present disclosure relates to the field of display technology, and more particularly, to a multiplex shift register unit and a driving circuit thereof, a display panel, and a display device.

BACKGROUND

Currently, three technologies of Oxide, TCON Embed Driver (TED) and Multiplexer (MUX) are used in combination to reduce power consumption for source driving. Here, Oxide products have a significant improvement on Ion as compared to A-silicon products, may be charged in a short time, and therefore may achieve higher data multiplexing than Dual Gate. One source channel may be used to charge three columns of pixels at the same time, and signals output from the source channel are output to pixel lines using three switches in a time division manner. This switching technology is referred to as MUX for short. The TED technology is used to integrate a TCON and a driver into one Integrated Circuit (IC) for processing to effectively reduce power consumption.

In the related art, a driving mode of the MUX is that a TED IC directly outputs two groups of switch signals, which are in a total of six switch signals. Each three switch signals of these switch signals are taken as one group, to control switching and charging of R, G and B pixels respectively.

However, due to characteristics of Thin Film Transistors (TFTs), when a TFT operates for a long time, it may cause drift. Therefore, the two groups of signals operate alternately every 2 seconds. Six lines may not only increase a width of wirings in a fan-out area and a variation in amplitude of the signals on the respective lines, but also may cause higher power consumption.

SUMMARY

According to a first aspect of the embodiments of the present disclosure, there is provided a multiplex shift register unit, comprising:

a shift register unit connected to an input terminal, a first power supply terminal, a second power supply terminal, a clock signal terminal, a reset terminal, and an output terminal respectively, and configured to transmit a clock signal provided at the clock signal terminal to the output terminal under control of an input signal provided at the input terminal, a first power supply signal provided at the first power supply terminal, and a second power supply signal provided at the second power supply terminal; and a multiplex unit connected to the output terminal, the first power supply terminal, the second power supply terminal, a first multiplex output terminal and a second multiplex output terminal respectively, and configured to transmit an output signal provided at the output terminal to the first multiplex output terminal or the second multiplex output terminal under control of the first power supply signal provided at the first power supply terminal and the second power supply signal provided at the second power supply terminal.

In an embodiment, the multiplex unit comprises:

a first transistor having a control electrode connected to the first power supply terminal, a first electrode connected to the output terminal, and a second electrode connected to the first multiplex output terminal; and a second transistor having a control electrode connected to the second power supply terminal, a first electrode connected to the output terminal, and a second electrode connected to the second multiplex output terminal.

In an embodiment, the first power supply terminal and the second power supply terminal are used to input power supply signals which are alternately at a high level and a low level respectively, wherein the power supply signals input at the first power supply terminal and the second power supply terminal are at opposite levels at the same time.

In an embodiment, the multiplex unit further comprises:

a third transistor having a control electrode and a first electrode both connected to the output terminal, and a second electrode connected to the first electrode of the first transistor and the first electrode of the second transistor respectively.

In an embodiment, when the multiplex shift register unit is used as a first stage of unit of a multiplex driving circuit, the shift register unit further comprises:

a fourth transistor having a control electrode and a first electrode connected to a multiplex input terminal respectively, and a second electrode connected to the output terminal through a capacitor.

According to a second aspect of the embodiments of the present disclosure, there is provided a multiplex driving circuit, comprising four cascaded multiplex shift register units described above, wherein except for a first stage of multiplex shift register unit, each stage of multiplex shift register unit receives an output signal from an output terminal of a previous stage of multiplex shift register unit as an input signal of the current stage of multiplex shift register unit, and except for a last stage of multiplex shift register unit, a reset terminal of each stage of multiplex shift register unit receives an output signal from an output terminal of a next stage of multiplex shift register unit.

In an embodiment, a clock signal terminal of each stage of multiplex shift register unit is connected to one of a first multiplex clock signal line and a second multiplex clock signal line, and clock signal terminals in two adjacent stages of multiplex shift register units are connected to different multiplex clock signal lines.

In an embodiment, the four multiplex shift register units comprise a first stage of multiplex shift register unit, a second stage of multiplex shift register unit, a third stage of multiplex shift register unit, and a fourth stage of multiplex shift register unit, wherein a first multiplex output terminal of the first stage of multiplex shift register unit is connected to a first R pixel driving line, and a second multiplex output terminal of the first stage of multiplex shift register unit is connected to a second R pixel driving line, a first multiplex output terminal of the second stage of multiplex shift register unit is connected to a first G pixel driving line, and a second multiplex output terminal of the second stage of multiplex shift register unit is connected to a second G pixel driving line, a first multiplex output terminal of the third stage of multiplex shift register unit is connected to a first B pixel driving line, and a second multiplex output terminal of the third stage of multiplex shift register unit is connected to a second B pixel driving line, and a first multiplex output terminal of the fourth stage of multiplex shift register unit is connected to the first G pixel driving line, and a second multiplex output terminal of the fourth stage of multiplex shift register unit is connected to the second G pixel driving line.

In an embodiment, clock signal terminals of the first stage of multiplex shift register unit and the third stage of multiplex shift register unit are connected to the first multiplex clock signal line respectively; and clock signal input terminals of the second stage of multiplex shift register unit and the fourth stage of multiplex shift register unit are connected to the second multiplex clock signal line respectively.

In an embodiment, a first power supply terminal of each stage of multiplex shift register unit is connected to a first power supply signal line, and a second power supply terminal of each stage of multiplex shift register unit is connected to a second power supply signal line.

In an embodiment, a ground terminal of each stage of multiplex shift register unit is connected to a ground signal line.

According to a third aspect of the embodiments of the present disclosure, there is provided a display panel comprising a pixel circuit and the multiplex driving circuit described above, wherein the pixel circuit comprises a plurality of pixel units each comprising a R pixel sub-unit, a G pixel sub-unit and a B pixel sub-unit, wherein the first R pixel driving line and the second R pixel driving line are connected to the R pixel sub-units through R pixel switches respectively, the first G pixel driving line and the second G pixel driving line are connected to the G pixel sub-units through G pixel switches respectively, and the first B pixel driving line and the second B pixel driving line are connected to the B pixel sub-units through B pixel switches respectively.

According to a fourth aspect of the embodiments of the present disclosure, there is provided a display device, comprising a housing and the display panel described above.

According to a fifth aspect of the embodiments of the present disclosure, there is provided a method for driving the multiplex shift register unit described above, comprising:

transmitting the clock signal to the output terminal under control of the input signal, the first power supply signal, and the second power supply signal; and transmitting the output signal provided at the output terminal to the first multiplex output terminal or the second multiplex signal terminal under control of the first power supply signal provided at the first power supply terminal and the second power supply signal provided at the second power supply terminal.

Additional aspects and advantages of the present disclosure will be given partly in the following description, may partly become apparent from the following description, or may be learned through the practice of the present disclosure.

DETAILED DESCRIPTION

Embodiments of the present disclosure will be described in detail below. Examples of the embodiments are shown in the accompanying drawings, throughout which the same or similar reference signs represent the same or similar elements or elements having the same or similar functions. The embodiments described below with reference to the accompanying drawings are exemplary, and are intended to explain the present disclosure, but should not be construed as limiting the present disclosure.

A multiplex shift register unit and a driving circuit thereof, a display panel, and a display device according to the embodiments of the present disclosure will be described below with reference to the accompanying drawings.

Figure 1:
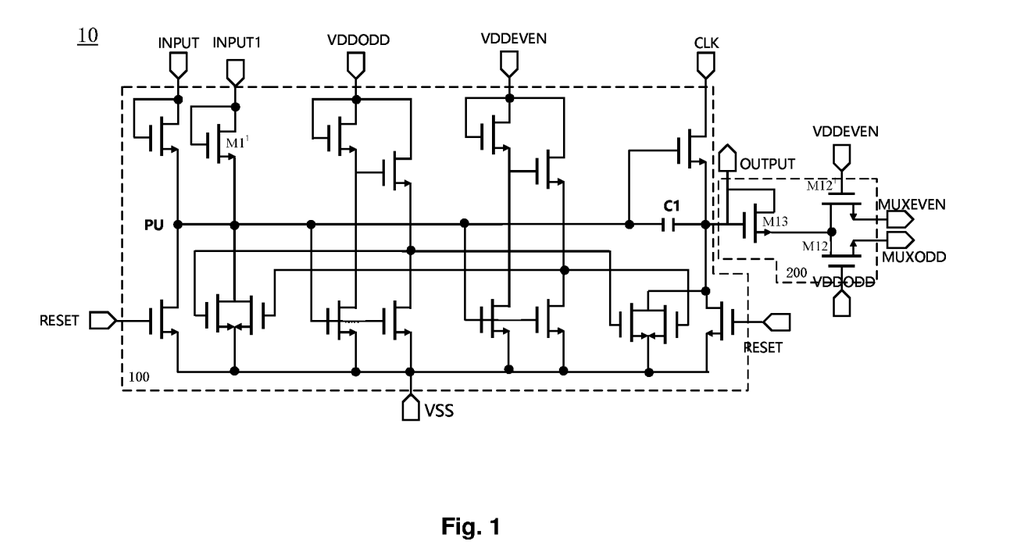
FIG. 1 is schematic a block diagram of a multiplex shift register unit according to an embodiment of the present disclosure.

FIG. 1 is a schematic block diagram of a multiplex shift register unit 10 according to an embodiment of the present disclosure. As shown in FIG. 1, the multiplex shift register unit 10 comprises a shift register unit 100 and a multiplex unit 200. The shift register unit 100 is connected to an input terminal INPUT, a first power supply terminal VDDEVEN, a second power supply terminal VDDODD, a clock signal terminal CLK, a reset terminal RESET, and an output terminal OUTPUT respectively. The shift register unit 100 transmits a clock signal provided at the clock signal terminal CLK to the output terminal OUTPUT under control of an input signal provided at the input terminal INPUT, a first power supply signal provided at the first power supply terminal VDDEVEN, and a second power supply signal provided at the second power supply terminal VDDODD. The multiplex unit 200 is connected to the output terminal OUTPUT, the first power supply terminal VDDEVEN, the second power supply terminal VDDODD, a first multiplex output terminal MUXEVEN, and a second multiplex output terminal MUXODD respectively. The multiplex unit 200 transmits an output signal provided at the output terminal OUTPUT to the first multiplex output terminal or the second multiplex output terminal under control of the first power supply signal provided at the first power supply terminal VDDEVEN and the second power supply signal provided at the second power supply terminal VDDODD. The first multiplex output terminal MUXEVEN is used to output a first multiplex signal; and the second multiplex output terminal MUXODD is used to output a second multiplex signal. In an embodiment, the multiplex shift register unit 10 may output multiplex signals alternately according to the first power supply terminal and the second power supply terminal, thereby realizing an alternate operation of MUXes, and greatly reducing power consumption.

The shift register unit 100 according to the embodiment of the present disclosure may be implemented using a shift register unit in the related art, and has the same function and structure as those of the shift register unit in the related art.

Figure 2:
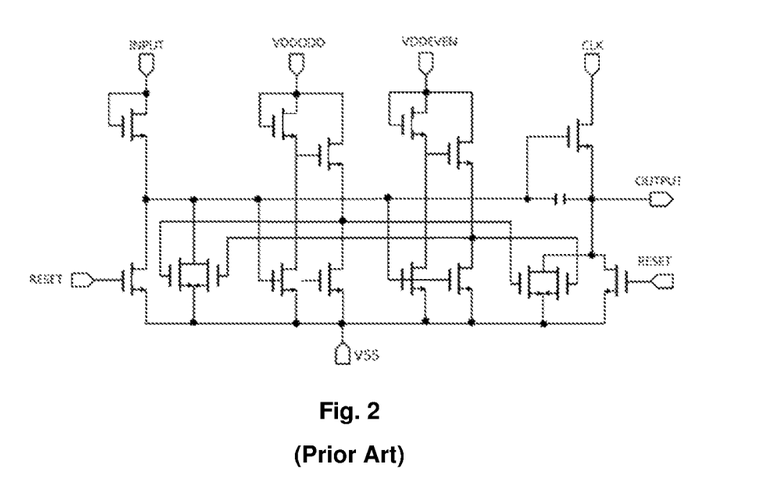
FIG. 2 is a schematic circuit diagram of a shift register unit in the related art.

As shown in FIG. 2, by taking a design using a 16T1C shift register unit and a 3MUX as an example, a technology of performing de-noising by causing VDDODD and VDDEVEN to operate alternately may effectively increase the service life of the shift register unit, and may perform de-noising all the time as compared to an alternating current model.

As shown in FIG. 1, the multiplex unit 200 comprises a first transistor M12$^1$ and a second transistor M12. The first transistor M12$^1$ has a control electrode connected to a first power supply terminal VDDEVEN, a first electrode connected to an output terminal OUTPUT, and a second electrode connected to a first multiplex output terminal MUXEVEN. The second transistor M12 has a control electrode connected to a second power supply terminal VDDODD, a first electrode connected to the output terminal OUTPUT, and a second electrode connected to a second multiplex output terminal MUXODD. A first power supply terminal VDDEVEN and a second power supply terminal VDDODD of the shift register unit are used to provide power supply signals which are alternatively at a high level and a low level respectively. The power supply signals input at the first power supply terminal VDDEVEN and the second power supply terminal VDDODD of the shift register unit are at opposite levels at the same time.

Specifically, in the embodiment of the present disclosure, the first multiplex output terminal MUXEVEN may be used to output a first multiplex signal, and the second multiplex output terminal MUXODD may be used to output a second multiplex signal. The control electrode of the transistor M12$^1$ is connected to the first power supply terminal VDDEVEN to be turned on or turned off under control of the first power supply terminal VDDEVEN; the first electrode of the first transistor M12$^1$ is connected to the output terminal OUTPUT to receive an output signal at the output terminal OUTPUT; and the second electrode of the first transistor M12$^1$ is connected to the first multiplex output terminal MUXEVEN to transmit the output signal received at the output terminal OUTPUT to the first multiplex output terminal MUXEVEN to output the first multiplex signal. The control electrode of the second transistor M12 is connected to the second power supply terminal VDDODD to be turned on or turned off under control of the second power supply terminal VDDODD; the first electrode of the second transistor M12 is connected to the output terminal OUTPUT to receive the output signal at the output terminal OUTPUT; and the second electrode of the second transistor M12 is connected to the second multiplex output terminal MUXODD to transmit the output signal received at the output terminal to the second multiplex output terminal MUXODD to output the second multiplex signal. Here, the first power supply terminal VDDEVEN and the second power supply terminal VDDODD of the shift register unit 100 are used to input power supply signals which are alternatively at a high level and a low level respectively, and the power supply signals input at the first power supply terminal VDDEVEN and the second power supply terminal VDDODD of the shift register unit 100 are at opposite levels at the same time. For example, the power supply signal input at the first power supply terminal VDDEVEN is at a high level and the power supply signal input at the second power supply terminal VDDODD is at a low level at the same time, for example, at a time t.

Thereby, with the multiplex shift register unit according to the embodiment of the present disclosure, the second electrode of the second transistor M12 may be multiplex by the second power supply terminal VDDODD, and when the power supply signal input at the second power supply terminal VDDODD is at a high level, the second transistor M12 is turned on, and the output signal at the output terminal OUTPUT of the shift register unit 100 is output to the second multiplex output terminal MUXODD to realize output of MUXes in an ODD group. Similarly, when the power supply signal input at the first power supply terminal VDDEVEN is at a high level, the first transistor M12$^1$ is turned on, and the output signal at the output terminal OUTPUT of the shift register unit 100 is output to the first multiplex output terminal MUXEVEN, to realize output of MUXes in an EVEN group. An alternate operation of the MUXes is realized by an alternate operation of the first transistor M12$^1$ and the second transistor M12.

According to an embodiment of the present disclosure, the multiplex unit 200 further comprises a third transistor M13. Here, the first electrode of the first transistor M12$^1$ and the first electrode of the second transistor M12 are connected to the output terminal through the third transistor M13 respectively. The third transistor M13 has a control electrode and a first electrode connected to the output terminal of the shift register unit 100 respectively, and a second electrode connected to the first electrode of the first transistor M12$^1$ and the first electrode of the second transistor M12 respectively.

Specifically, as shown in FIG. 1, the first electrode of the first transistor M12$^1$ and the first electrode of the second transistor M12 are connected to the output terminal of the shift register unit 100 through the third transistor M13 respectively, and the third transistor M13 has an isolation function, which may effectively prevent backflush at the first multiplex output terminal MUXEVEN or the second multiplex output terminal MUXODD, and avoid affecting a logic of the output terminal OUTPUT of the shift register unit 100.

According to an embodiment of the present disclosure, the multiplex shift register unit is used as a first stage of unit of a multiplex driving circuit. As shown in FIG. 1, the shift register unit 100 further comprises a multiplex input terminal INPUT1 and a fourth transistor M1$^1$. Here, the multiplex input terminal INPUT1 is used to input a frame start signal. The fourth transistor M1$^1$ has a control electrode and a first electrode both connected to the multiplex input terminal INPUT1, and a second electrode connected to the output terminal OUTPUT through a capacitor C1.

Specifically, as shown in FIG. 1, when the multiplex shift register unit is used as the first stage of unit of the multiplex driving circuit, the multiplex input terminal INPUT1 may be used to input a frame start signal, for example, an STV signal, and when the multiplex driving circuit is formed by cascading, for example, four multiplex shift register units, the input terminal INPUT of the first stage of multiplex shift register unit may also be used to receive an output signal from a fourth stage of multiplex shift register unit. That is, the first stage of multiplex shift register unit may also operate under control of the output signal from the fourth stage of shift register unit.

With the multiplex shift register unit according to the embodiment of the present disclosure, the first power supply terminal and the second power supply terminal may alternately output the power supply signals, so that the first transistor and the second transistor alternately operate, thereby realizing an alternate operation of MUXes, and greatly reducing power consumption.

Figure 3:
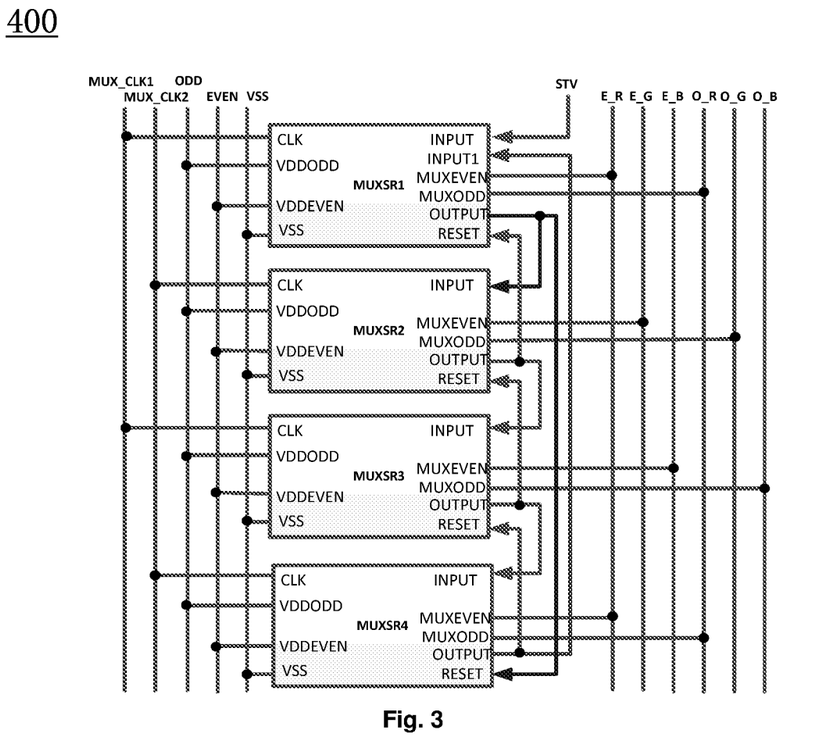
FIG. 3 is a schematic circuit diagram of a multiplex driving circuit according to an embodiment of the present disclosure.

FIG. 3 is a schematic circuit diagram of a multiplex driving circuit according to an embodiment of the present disclosure. As shown in FIG. 3, the multiplex driving circuit 400 comprises four cascaded multiplex shift register units described above.

Here, the four multiplex shift register units comprise a first stage of multiplex shift register unit (for example, MUXSR1), a second stage of multiplex shift register unit (for example, MUXSR2), a third stage of multiplex shift register unit (for example, MUXSR3) and a fourth stage of multiplex shift register unit (for example, MUXSR4). A first multiplex output terminal of the first stage of multiplex shift register unit is connected to a first R pixel driving line, and a second multiplex output terminal of the first stage of multiplex shift register unit is connected to a second R pixel driving line. A first multiplex output terminal of the second stage of multiplex shift register unit is connected to a first G pixel driving line, and a second multiplex output terminal of the second stage of multiplex shift register unit is connected to a second G pixel driving line. A first multiplex output terminal of the third stage of multiplex shift register unit is connected to a first B pixel driving line, and a second multiplex output terminal of the third stage of multiplex shift register unit is connected to a second B pixel driving line. A first multiplex output terminal of the fourth stage of multiplex shift register unit is connected to the first G pixel driving line, and a second multiplex output terminal of the fourth stage of multiplex shift register unit is connected to the second G pixel driving line.

As shown in FIG. 3, in the embodiment of the present disclosure, output of MUX signals may be realized through the four cascaded multiplex shift register units. First multiplex output terminals of the first stage of multiplex shift register unit to the fourth stage of multiplex shift register unit may all be MUXEVEN terminals, second multiplex output terminals of the first stage of multiplex shift register unit to the fourth stage of multiplex shift register unit may all be MUXODD terminals, the first R pixel driving line may be an E-R line, the first G pixel driving line may be an E-G line, the first B pixel driving line may be an E-B line, the second R pixel driving line may be an O-R line, the second G pixel driving line may be an O-G line, and the second B pixel driving line may be an O-B line.

In an embodiment, except for the first stage of multiplex shift register unit, each stage of multiplex shift register unit (for example, MUXSR2 and MUXSR3) receives an output signal from an output terminal OUTPUT of a previous stage of multiplex shift register unit as an input signal of the current stage of multiplex shift register unit. In some embodiments, except for a last stage of multiplex shift register unit MUXSR4, a reset terminal RESET of each stage of multiplex shift register unit also receives an output signal from an output terminal OUTPUT of a next stage of multiplex register unit. A reset terminal RESET of the last stage of multiplex register unit MUXSR4 receives a signal from an output terminal OUTPUT of the first stage of multiplex shift register unit MUXSR1, and an output terminal OUTPUT of MUXSR4 is also connected to a multiplex input terminal INPUT1 of MUXSR1. As shown in FIG. 3, an output terminal OUTPUT of the second stage of multiplex shift register unit is connected to a reset terminal RESET of the first stage of multiplex shift register unit and an input terminal INPUT of the third stage of multiplex shift register unit respectively. An output terminal OUTPUT of the third stage of multiplex shift register unit is connected to a reset terminal RESET of the second stage of multiplex shift register unit and an input terminal INPUT of the fourth stage of multiplex shift register unit respectively.

In addition, as shown in FIG. 3, for the first stage of multiplex shift register unit and the fourth stage of multiplex shift register unit, the output terminal OUTPUT of the first stage of multiplex shift register unit is connected to a reset terminal RESET of the fourth stage of multiplex shift register unit and an input terminal INPUT of the second stage of multiplex shift register unit respectively; and the output terminal OUTPUT of the fourth stage of multiplex shift register unit is connected to a reset terminal RESET of the third stage of multiplex shift register unit and the multiplex input terminal INPUT1 of the first stage of multiplex shift register unit respectively.

In an embodiment, a clock signal terminal CLK of each stage of multiplex shift register unit is connected to one of a first multiplex clock signal line MUX_CLK1 and a second multiplex clock signal line MUX_CLK2. In some embodiments, clock signal terminals in two adjacent stages of shift register units are connected to different multiplex clock signal lines.

As shown in FIG. 3, clock signal input terminals of the first stage of multiplex shift register unit and the third stage of multiplex shift register unit are connected to the first multiplex clock signal line respectively. Clock signal input terminals of the second stage of multiplex shift register unit and the fourth stage of multiplex shift register unit are connected to the second multiplex clock signal line respectively.

Specifically, as shown in FIG. 3, the clock signal input terminals CLK of the first stage of multiplex shift register unit and the third stage of multiplex shift register unit are connected to the first multiplex clock signal line MUX_CLK1 respectively. The clock signal input terminals CLK of the second stage of multiplex shift register unit and the fourth stage of multiplex shift register unit are connected to the second multiplex clock signal line MUX_CLK2 respectively.

According to an embodiment of the present disclosure, a first power supply terminal of each shift register unit is connected to a first power supply signal line, and a second power supply terminal of each shift register unit is connected to a second power supply signal line.

Specifically, the first power supply signal line may be EVEN, and the first power supply terminals VDDEVEN of the first stage of multiplex shift register unit to the fourth stage of multiplex shift register unit are all connected to the first power supply signal line EVEN. The second power supply signal line may be ODD, and the second power supply terminals VDDODD of the first stage of multiplex shift register unit to the fourth stage of multiplex shift register unit are all connected to the second power supply signal line ODD.

According to an embodiment of the present disclosure, as shown in FIG. 3, a ground terminal of each multiplex shift register unit is connected to a ground signal line.

Specifically, as shown in FIG. 3, the ground terminal may be VSS, and the ground terminals VSS of the first stage of multiplex shift register unit to the fourth stage of multiplex shift register unit are connected to the ground signal line VSS.

In order for those skilled in the art to further understand the driving circuit of the multiplex switch according to the embodiment of the present disclosure, a specific embodiment is used to explain a principle of using the multiplex driving circuit to realize output of six MUX driving signals and a driving timing diagram of output of MUXes.

FIG. 3 illustrates a cascaded structure diagram of a multiplex driving circuit 400 according to an embodiment of the present disclosure. The multiplex driving circuit 400 comprises four cascaded multiplex shift register units according to any of the above embodiments. Here, the first stage of multiplex shift register unit MUXSR1 may be provided at a back end of a gate driving circuit (comprising multiple cascaded shift register units shown in FIG. 2), and an input terminal INPUT of the first stage of multiplex shift register unit MUXSR1 may receive a frame start signal STV, that is, STV is multiplexed by the first stage of shift register unit in the gate driving circuit. In some embodiments, a duty cycle of the frame start signal STV is adjustable.

With reference to FIG. 1 and FIG. 3, when the STV signal is at a high level, a pull-up PU point of the first stage of multiplex shift register unit is charged, and a first pulse of the first multiplex clock signal line MUX_CLK1 is provided to the first stage of multiplex shift register unit, and is selected to be output to the first R pixel driving line which is the E-R line or the second R pixel driving line which is the O-R line for driving switches of R pixels according to levels at the first power supply signal line EVEN and the second power supply signal line ODD. At the same time, a PU point of the second stage of multiplex shift register unit is charged, and a first pulse of the second multiplex clock signal line MUX_CLK2 is provided to the second stage of multiplex shift register unit, and is selected to be output to the first G pixel driving line which is the E-G line or the second G pixel driving line which is the O-G line for driving switches of G pixels according to the levels at the first power supply signal line EVEN and the second power supply signal line ODD. At the same time, the PU point of the first stage of multiplex shift register unit is reset, a PU point of the third stage of multiplex shift register unit is charged, and a second pulse of the first multiplex clock signal line MUX_CLK1 is provided to the third stage of multiplex shift register unit, and at the same time is selected to be output to the first B pixel driving line which is the E-B line or the second B pixel driving line which is the O-B line for driving switches of B pixels according to the levels at the first power supply signal line EVEN and the second power supply signal line ODD. At the same time, the PU point of the second stage of multiplex shift register unit is reset, a PU point of the fourth stage of multiplex shift register unit is charged, and a second pulse of the second multiplex clock signal line MUX_CLK2 is output to the fourth stage of multiplex shift register unit, and at the same time is selected to be output to the first G pixel driving line which is the E-G line or the second G pixel driving line which is the O-G line for driving the switches of the G pixels according to the levels at the first power supply signal line EVEN and the second power supply signal line ODD. At the same time, the PU point of the third stage of multiplex shift register unit is reset, the PU point of the first stage of multiplex shift register unit is charged, and a third pulse of the first multiplex clock signal MUX_CLK1 is provided to the first stage of multiplex shift register. In this way, the scanning processes are performed sequentially and continuously loop, thereby realizing the output of the six MUX driving signals.

Figure 4:
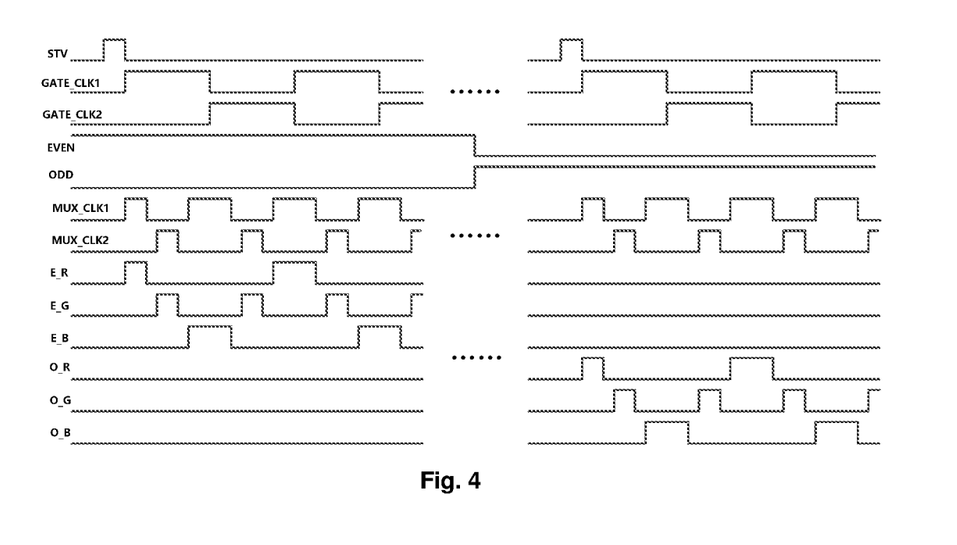
FIG. 4 is a driving timing diagram of a multiplex driving circuit according to an embodiment of the present disclosure.

As shown in FIG. 4, in an embodiment of the present disclosure, a 3MUX design may be used. When gate lines are scanned once, three columns of pixels may be charged. Specifically, when an STV signal is at a high level, a shift register unit in a gate driver may start scanning, and at the same time, a multiplex shift register unit also starts scanning. When a first gate driving clock signal line GATE_CLK1 is at a high level, a first row of gate lines is turned on, and when a first power supply signal line EVEN is at a high level, a multiplex shift register unit MUXSR1 firstly outputs a first pulse of MUX_CLK1 to an E_R line to drive all transistors connected to R pixels to be turned on, so as to start to charge the R pixels, and the transistors are turned off after the charging is performed for a 1H period. In an embodiment, the pulse is at a high level for the 1H period. Then, a multiplex shift register unit MUXSR2 outputs a first pulse of MUX_CLK2 to an E_G line to drive all transistors connected to G pixels to be turned on, so as to start to charge the G pixels, and the transistors are turned off after the charging is performed for the 1H period. Then, a multiplex shift register unit MUXSR3 outputs a second pulse of MUX_CLK1 to an E_B line, to drives all transistors connected to B pixels to be turned on, so as to start to charge the B pixels, and after the charging is performed for a first 1H period of the second pulse, GATE_CLK1 is at a low level, and the first row of gate lines is turned off, thereby completing the charging of the first row of pixels.

Then a second gate driving clock signal line GATE_CLK2 is at a high level, a second row of gate lines is turned on, MUX_CLK1 is still at a high level, and the multiplex shift register unit MUXSR3 starts to charge all the B pixels in a second row of B pixels for a second 1H period of the second pulse of MUX_CLK1, and transistors connected to the B pixels are turned off after the charging is performed for the 1H period. Then, a multiplex shift register unit MUXSR4 outputs the second pulse of MUX_CLK2 to an E_G line to drives all transistors connected to G pixels to be turned on, so as to start to charge the G pixels, and the transistors are turned off after the charging is performed for the 1H period. Then, the MUX shift register 1 outputs a third pulse of MUX_CLK1 to an E_R line to drive all transistors connected to R pixels to be turned on, so as to start to charge the R pixels, and after the charging is performed for a first 1H period of the third pulse, GATE_CLK2 is at a low level, and the second row of gate lines is turned off, thereby completing the charging of the second row of pixels.

Then, a third row of gate lines is turned on, the multiplex shift register unit MUXSR1 starts to charge R pixels for a second 1H period of the third pulse of MUX_CLK1. In this way, the scanning processes are performed sequentially and continuously loop, thereby completing the charging of the entire frame.

It should be illustrated that the first power supply signal EVEN and the second power supply signal ODD may be switched every two seconds. When the second power supply signal ODD is at a high level, all the multiplex shift register units output signals to O_R, O_G and O_B lines, to drive transistors in an ODD group to operate. Similarly, when the first power supply signal EVEN is at a high level, transistors in an EVEN group are driven to operate, thereby effectively preventing the characteristic drift caused by the long-term operation of the transistors, while increasing the service life. In addition, in the embodiment of the present disclosure, the charging is implemented in a manner of realizing a cycle every two rows in an order of charging a first row in a RGB order, and charging a second row in a BGR order, which, as compared to charging each row in the RGB order in the related art, not only reduces a number of inversions of the first multiplex clock signal MUX_CLK1 by one half, but also effectively reduces power consumption.

With the driving circuit of the multiplex switch according to the embodiment of the present disclosure, four multiplex shift register units are cascaded on the basis of the gate driving circuit, to perform switching cyclically, which realizes a driving circuit for six MUXes, thereby not only effectively saving channels of an IC and realizing a reduced width of wirings in a fan-out area, but also achieving a narrower bezel while effectively reducing power consumption due to variation in amplitude of only two lines.

Figure 5:
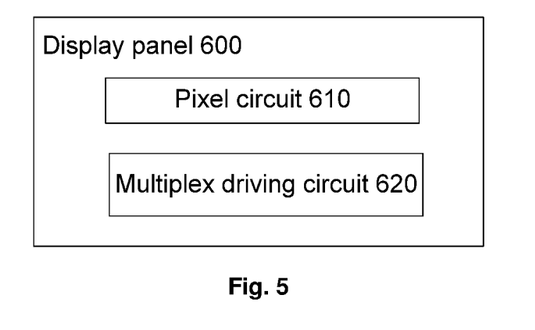
FIG. 5 is a schematic block diagram of a display panel according to an embodiment of the present disclosure.

As shown in FIG. 5, the embodiments of the present disclosure propose a display panel 600 comprising the pixel circuit 610 described above and the multiplex driving circuit 620 described above. The pixel circuit 610 comprises R pixel switches, G pixel switches, and B pixel switches. Here, a first R pixel driving line and a second R pixel driving line are connected to the R pixels through the R pixel switches respectively, a first G pixel driving line and a second G pixel driving line are connected to G pixels through the G pixel switches respectively, and a first B pixel driving line and a second B pixel driving line are connected to B pixels through the B pixel switches respectively.

With the display panel according to the embodiment of the present disclosure, four multiplex shift register units are cascaded on the basis of the gate driving circuit, to perform switching cyclically, which realizes a driving circuit for six MUXes, thereby not only effectively saving channels of an IC and realizing a reduced width of wirings in a fan-out area, but also achieving a narrower bezel while effectively reducing power consumption due to variation in amplitude of only two lines.

Figure 6:
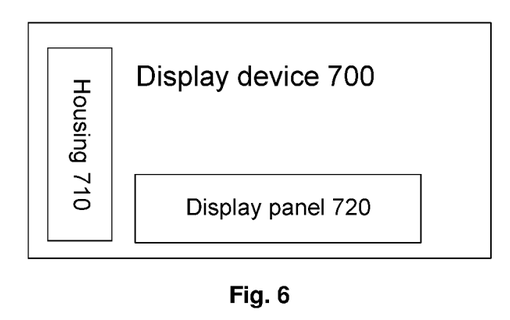
FIG. 6 is a schematic block diagram of a display device according to an embodiment of the present disclosure.

As shown in FIG. 6, the embodiments of the present disclosure propose a display device 700 comprising a housing 710 and the display panel 720 described above.

With the display device according to the embodiment of the present disclosure, four multiplex shift register units are cascaded on the basis of the gate driving circuit by using the display panel described above, to perform switching cyclically, which realizes a driving circuit for six MUXes, thereby not only effectively saving channels of an IC and realizing a reduced width of wirings in a fan-out area, but also achieving a narrower bezel while effectively reducing power consumption due to variation in amplitude of only two lines.

Figure 7:
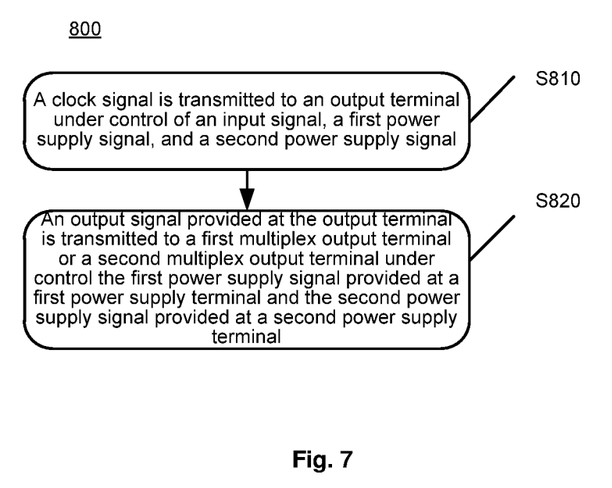
FIG. 7 is a flowchart of a method for driving a multiplex shift register unit according to an embodiment of the present disclosure.

FIG. 7 illustrates a flowchart of a method 800 for driving a multiplex shift register unit according to an embodiment of the present disclosure. The method comprises the following steps.

In S810, a clock signal is transmitted to an output terminal under control of an input signal, a first power supply signal, and a second power supply signal.

In S820, an output signal provided at the output terminal is transmitted to a first multiplex output terminal or a second multiplex output terminal under control the first power supply signal provided at a first power supply terminal and the second power supply signal provided at a second power supply terminal.

In the description of the present disclosure, it should be understood that an orientation or position relationship indicated by terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential" etc. is an orientation or position relationship based on the accompanying drawings, which is only used for the convenience of describing the present disclosure and simplifying the description, rather than indicating or implying that an apparatus or element indicated must have a specific orientation and must be constructed and operate in a specific orientation, and therefore may not be understood as limiting the present disclosure.

In addition, terms "first" and "second" are used for descriptive purposes only, and may not be understood as indicating or implying relative importance or implicitly indicating a number of technical features indicated. Therefore, features defined by "first" and "second" may explicitly or implicitly comprise at least one of the features. In the description of the present disclosure, "a plurality of" means at least two, for example, two, three, etc., unless specifically defined otherwise.

In the present disclosure, terms "installed" "connected with", "connected to" and "fixed" etc. should be understood broadly unless explicitly stated and defined otherwise, for example, there may be fixed or detachable or integrated connections; there may be mechanical or electrical connections; there may be direct connections or indirect connections through an intermediate medium, which may be internal connections in two elements or interaction between two elements, unless specifically defined otherwise. For those of ordinary skill in the art, the specific meanings of the above terms in the present disclosure may be understood according to specific situations.

In the present disclosure, unless explicitly stated and defined otherwise, the statement that a first feature is "on" or "below" a second feature may refer to that the first feature is in direct contact with the second feature, or the first feature is in indirect contact with the second feature through an intermediate medium. Moreover, the statement that the first feature is "on", "above", and "upon" the second feature may refer to that the first feature is directly above or obliquely above the second feature, or only indicates that the first feature is higher in level than the second feature. The statement that the first feature is "below", "beneath", and "under" the second feature may refer to that the first feature is directly below or obliquely below the second feature, or only indicates that the first feature is lower in level than the second feature.

In the description of this specification, the description with reference to the terms "one embodiment", "some embodiments", "examples", "specific examples", or "some examples" etc. means that specific features, structures, materials or characteristics described in conjunction with the embodiments or examples are included in at least one embodiment or example of the present disclosure. In this specification, schematic expressions of the above terms are not necessarily directed to the same embodiment or example. Moreover, the particular features, structures, materials, or characteristics described may be combined in any suitable manner in any one or more embodiments or examples. In addition, those skilled in the art may integrate and combine different embodiments or examples and features of the different embodiments or examples described in this specification without any contradiction.

Although the embodiments of the present disclosure have been shown and described above, it may be understood that the above embodiments are exemplary and should not be construed as limiting the present disclosure. Those of ordinary skill in the art may make changes, modifications, substitutions, and variations to the above embodiments within the scope of the present disclosure.

We claim:

1. A multiplex shift register unit, comprising:
a shift register unit connected to an input terminal, a first power supply terminal, a second power supply terminal, a clock signal terminal, a reset terminal, and an output terminal respectively, and configured to transmit a clock signal provided at the clock signal terminal to the output terminal under control of an input signal provided at the input terminal, a first power supply signal provided at the first power supply terminal, and a second power supply signal provided at the second power supply terminal; and a multiplex unit connected to the output terminal, the first power supply terminal, the second power supply terminal, a first multiplex output terminal and a second multiplex output terminal respectively, and configured to transmit an output signal provided at the output terminal to the first multiplex output terminal or the second multiplex output terminal under control of the first power supply signal provided at the first power supply terminal and the second power supply signal provided at the second power supply terminal, wherein the multiplex unit further comprises:

a first transistor having a control electrode connected to the first power supply terminal, a first electrode connected to the output terminal, and a second electrode connected to the first multiplex output terminal;

a second transistor having a control electrode connected to the second power supply terminal, a first electrode connected to the output terminal, and a second electrode connected to the second multiplex output terminal; and a third transistor having a control electrode and a first electrode both connected to the output terminal, and a second electrode connected to the first electrode of the first transistor and the first electrode of the second transistor respectively.

2. The multiplex shift register unit according to claim 1, wherein the first power supply terminal and the second power supply terminal are used to input power supply signals which are alternately at a high level and a low level respectively, wherein the power supply signals input at the first power supply terminal and the second power supply terminal are at opposite levels at the same time.

3. The multiplex shift register unit according to claim 1, wherein when the multiplex shift register unit is used as a first stage of unit of a multiplex driving circuit, the shift register unit further comprises:

a fourth transistor having a control electrode and a first electrode connected to a multiplex input terminal respectively, and a second electrode connected to the output terminal through a capacitor.

4. A multiplex driving circuit, comprising four cascaded multiplex shift register units according to claim 1, wherein except for a first stage of multiplex shift register unit, each stage of multiplex shift register unit receives an output signal from an output terminal of a previous stage of multiplex shift register unit as an input signal of the current stage of multiplex shift register unit, and except for a last stage of multiplex shift register unit, a reset terminal of each stage of multiplex shift register unit receives an output signal from an output terminal of a next stage of multiplex shift register unit.

5. The multiplex driving circuit according to claim 4, wherein a clock signal terminal of each stage of multiplex shift register unit is connected to one of a first multiplex clock signal line and a second multiplex clock signal line, and clock signal terminals in two adjacent stages of multiplex shift register units are connected to different multiplex clock signal lines.

6. The multiplex driving circuit according to claim 5, wherein the four multiplex shift register units comprise a first stage of multiplex shift register unit, a second stage of multiplex shift register unit, a third stage of multiplex shift register unit, and a fourth stage of multiplex shift register unit, wherein a first multiplex output terminal of the first stage of multiplex shift register unit is connected to a first R pixel driving line, and a second multiplex output terminal of the first stage of multiplex shift register unit is connected to a second R pixel driving line, a first multiplex output terminal of the second stage of multiplex shift register unit is connected to a first G pixel driving line, and a second multiplex output terminal of the second stage of multiplex shift register unit is connected to a second G pixel driving line, a first multiplex output terminal of the third stage of multiplex shift register unit is connected to a first B pixel driving line, and a second multiplex output terminal of the third stage of multiplex shift register unit is connected to a second B pixel driving line, and a first multiplex output terminal of the fourth stage of multiplex shift register unit is connected to the first G pixel driving line, and a second multiplex output terminal of the fourth stage of multiplex shift register unit is connected to the second G pixel driving line.

7. The multiplex driving circuit according to claim 6, wherein clock signal terminals of the first stage of multiplex shift register unit and the third stage of multiplex shift register unit are connected to the first multiplex clock signal line respectively; and clock signal input terminals of the second stage of multiplex shift register unit and the fourth stage of multiplex shift register unit are connected to the second multiplex clock signal line respectively.

8. The multiplex driving circuit according to claim 4, wherein a first power supply terminal of each stage of multiplex shift register unit is connected to a first power supply signal line, and a second power supply terminal of each stage of multiplex shift register unit is connected to a second power supply signal line.

9. The multiplex driving circuit according to claim 4, wherein a ground terminal of each stage of multiplex shift register unit is connected to a ground signal line.

10. A display panel comprising a pixel circuit and the multiplex driving circuit according to claim 4, wherein the pixel circuit comprises a plurality of pixel units each comprising a R pixel sub-unit, a G pixel sub-unit and a B pixel sub-unit, wherein the first R pixel driving line and the second R pixel driving line are connected to the R pixel sub-units through R pixel switches respectively, the first G pixel driving line and the second G pixel driving line are connected to the G pixel sub-units through G pixel switches respectively, and the first B pixel driving line and the second B pixel driving line are connected to the B pixel sub-units through B pixel switches respectively.

11. A display device, comprising a housing and the display panel according to claim 10.

12. A method for driving the multiplex shift register unit according to claim 1, comprising:

transmitting the clock signal to the output terminal under control of the input signal, the first power supply signal, and the second power supply signal; and transmitting the output signal provided at the output terminal to the first multiplex output terminal or the second multiplex signal terminal under control of the first power supply signal provided at the first power supply terminal and the second power supply signal provided at the second power supply terminal.

* * * * *